United States Patent
Kim et al.

[19]

[11] Patent Number: 5,936,813
[45] Date of Patent: Aug. 10, 1999

[54] GIANT MAGNETORESISTIVE HEAD WITH ELECTRON CURED INSULATOR

[75] Inventors: Young Keun Kim, Boulder; Michael J. Jennison, Broomfield, both of Colo.

[73] Assignee: Quantum Peripherals Colorado, Inc., Louisville, Colo.

[21] Appl. No.: 09/128,332

[22] Filed: Aug. 3, 1998

Related U.S. Application Data

[62] Division of application No. 08/812,592, Mar. 7, 1997, Pat. No. 5,843,537.

[51] Int. Cl.$^6$ ........................................................ G11B 5/39
[52] U.S. Cl. ................................................................ 360/113
[58] Field of Search ............................. 360/113; 324/252; 338/32 R

[56] References Cited

U.S. PATENT DOCUMENTS

| | | | |
|---|---|---|---|
| 4,652,954 | 3/1987 | Church | 360/120 |
| 5,003,178 | 3/1991 | Livesay | 250/492.3 |
| 5,122,440 | 6/1992 | Chien | 430/315 |
| 5,180,653 | 1/1993 | Miyabe | 430/296 |
| 5,270,895 | 12/1993 | Ruigrok et al. | 360/113 |
| 5,557,492 | 9/1996 | Gill et al. | 360/113 |
| 5,580,602 | 12/1996 | McKean | 427/127 |
| 5,793,579 | 8/1998 | Yamamoto et al. | 360/113 |

OTHER PUBLICATIONS

Livesay, W.R. et al., Electron beam hardening of photoresist, SPIE vol. 1925 pp. 4126–436 (1993).

*Primary Examiner*—Robert S. Tupper
*Attorney, Agent, or Firm*—Stuart T. Langley; William J. Kubida; Holland & Hart LLP

[57] ABSTRACT

A process for making a magnetic head including the steps of forming a first pole piece comprising magnetic material and depositing a gap-forming layer comprising nonmagnetic material over the first pole piece. A first patterned layer of uncrosslinked polymer is formed on the gap-forming layer. The first patterned layer is cured by electron irradiation at a temperature less than about 175 C. to crosslink the polymer. A conductive coil is formed on the cured first patterned layer and a second patterned layer of uncrosslinked polymer is formed over the conductive coil. The second patterned layer is cured by electron irradiation at a temperature less than about 175 C. to crosslink the polymer. A second pole piece layer of magnetic material is formed to complete the magnetic head.

7 Claims, 11 Drawing Sheets

GIANT MAGNETORESISTIVE HEAD WITH ELECTRON CURED INSULATOR

The present application is a divisional application of U.S. patent application Ser. No. 08/812,592 filed Mar. 7, 1997, incorporated in its entirety herein by reference, with priority under 35 U.S.C. § 120 therefrom hereby claimed, now U.S. Pat. No. 5,843,537.

BACKGROUND OF THE INVENTION

1. Field of the Invention

The present invention relates, in general, to a magnetoresistive (MR) read/write head and method for making a MR read/write head, and, more particularly, to a giant magnetoresistive (GMR) read/write head having an electron beam cured insulator layer and method for making a (GMR) read/write head.

2. Relevant Background

The desktop personal computer market continues to demand higher capacity and faster performance from hard disk and tape drives. With applications such as file downloading, increased file sizes, advanced operating systems, and multimedia applications, demand for hard disk drive capacity, for example, is doubling every year. This trend has pushed entry level drive capacities to above two gigabyte (GB). Technologies for storing and retrieving data from magnetic media must also be cost effective. Because lower cost per megabyte (MB) is also desired, the prior practice of simply adding more disks and heads to a hard drive is less and less effective.

Disk and tape drive suppliers continue to increase areal densities, or the number of data bits per square inch, to meet the increasing demand for storage at competitive pricing. However, increasing areal density results in smaller recorded patterns on the disk, hence, weaker signals generated by the read head. Read and write head design are key technologies needed to achieve these capacity increases.

To compensate for the weaker signals, read heads are designed to fly only a few microinches from the magnetic medial. Because this distance is already much less than the size of a dust particle, it is unlikely that further improvements can be achieved by moving the heads closer to the media. Moreover, reliability becomes a significant concern as the heads are moved closer to the media.

Hard disk drives with areal densities under 1.0 Gigabits/in$^2$ typically use inductive heads. Inductive heads offer low cost and mature processing technology suitable for high volume production. To increase the signal strength from an inductive head, designers have increased the number of turns in the read head as the read signal is directly proportional to the number of turns. Some inductive heads use fifty or more turns in the read/write head. However, increasing the number of turns increases the head's inductance. There is a limit to the amount of inductance a head can tolerate to effectively perform data write operations. Since thin-film inductive heads use the same inductive element for both reading and writing, the head cannot be optimized for either operation. Moreover, the increased inductance decreases the frequency at which data can be written to and read from the magnetic media.

Magnetoresistive (MR) head technology is used to provide higher areal density than possible with inductive heads in both disk and tape drives. MR head structures include an MR element as a magnetic field sensor. A coil is formed above the read head and surrounded by a magnetic yoke that defines a write element. The write element is positioned over or adjacent to the MR element in an integrated structure. Although the coil and yoke are magnetically coupled, they are separated by an insulating material to prevent current flow between the coils and the yoke. In the past, this insulating material comprises thermally-cured photoresist.

MR head technology can deliver up to four times the areal density possible with thin-film inductive heads. Separate read and write heads allow each head to be optimized for one particular function (i.e., reading or writing data). With the MR head, the number of wire turns in the write element can be greatly reduced, resulting in a low inductance head enabling high frequency write operations. Using an MR structure as a read element provides high signal output and low noise compared to inductive heads. MR heads are also less sensitive to head misalignment because the read head can be made much smaller than the write head ensuring that the read head will remain over the much wider data path defined by the write head even if the heads are slightly misaligned.

Magnetoresistive devices or heads utilizing giant magnetoresistance (GMR) are of current technological interest to achieve high areal density recording. Magnetic field sensors based on the GMR effect are designed to measure or sense magnetic field strength. GMR sensors have greater output than conventional anisotropic magnetoresistive (AMR) sensors because GMR sensor structure offers higher magnetoresistance ratio as compared to an AMR sensor. Like AMR sensor, GMR sensors directly detect the magnetic field rather than the rate of change in magnetic field (i.e., flux) therefore, they are useful as read heads for sensing data stored on magnetic media. The output of GMR sensors is frequency insensitive and the sensor produces an output even in a constant magnetic field. GMR devices are sensitive to small magnetic fields and because they can be physically small, they promise higher areal density for magnetic storage devices. These factors make a GMR sensor a desirable choice for read heads.

The GMR effect occurs in metallic thin films comprising magnetic layers of a few nanometers thickness separated by equally thin nonmagnetic layers. Large changes in the resistance of GMR films occur when a magnetic field is applied. Unfortunately, even moderate temperatures above about 180 C. cause interdiffusion between the thin film layers. The interdiffusion reduces the GMR sensitivity of resistance to magnetic field strength. Prior MR processing technology requires temperatures above 180 C. for extended periods of time during formation of insulating materials in the write head and so is incompatible with GMR read elements.

U.S. Pat. No. 5,003,178 issued to Livesay on Mar. 26, 1991 describes a large area uniform electron source. One application of the Livesay electron source is photoresist curing. However, the Livesay electron source as disclosed exhibits several limitations that have prevented the use of electron beam resist curing in the production of read/write heads using GMR materials. A need remains for a process and apparatus for forming thin insulating layers that is compatible with MR and GMR read/write head technology.

SUMMARY OF THE INVENTION

Briefly stated, the present invention involves a process for making a magnetic head including the steps of forming a first pole piece comprising magnetic material and depositing a gap-forming layer comprising nonmagnetic material over the first pole piece. A first patterned layer of uncrosslinked polymer is formed on the gap-forming layer. The first patterned layer is cured by electron irradiation at a temperature less than about 175 C. to crosslink the polymer. A conductive coil is formed on the cured first patterned layer and a second patterned layer of uncrosslinked polymer is formed over the conductive coil. The second patterned layer is cured by electron irradiation at a temperature less than about 175 C. to crosslink the polymer. A second pole piece layer of magnetic material is formed to complete the magnetic head.

In another aspect, the present invention involves a head structure for writing data on a magnetic disk. The head includes a first pole having an upper surface and a first electron cured insulator layer covering a portion of the upper surface. A plurality of conductive coils are formed on the first electron cured insulator layer. And a second electron cured insulator layer fills between and covers the plurality of coils. A second pole covers the second electron cured insulator layer so as to define a write gap between the first pole and the second pole.

DETAILED DESCRIPTION OF THE PREFERRED EMBODIMENTS

Figure 1:
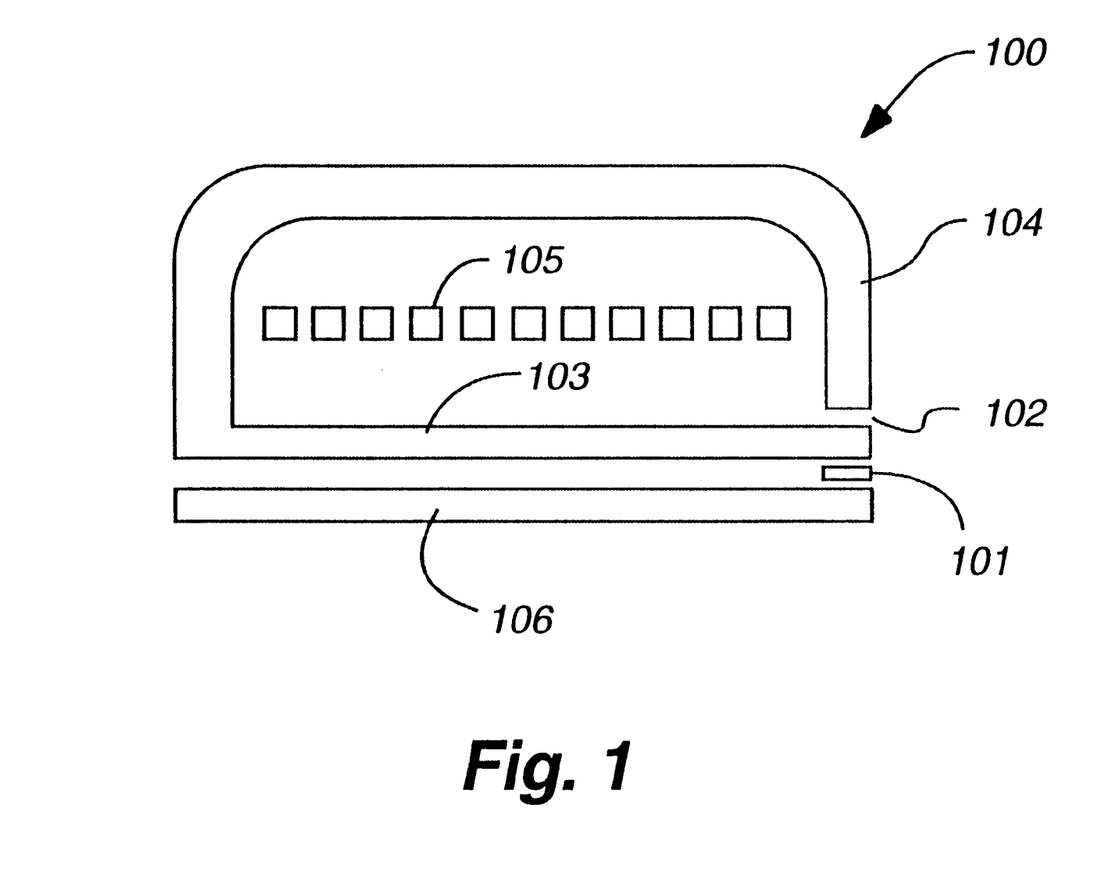
FIG. 1 shows a simplified cross-section view of a MR or GMR read/write head in accordance with the present invention.

Magnetoresistive (MR) and giant magnetoresistive (GMR) read/write heads, such as read/write head 100 shown in FIG. 1, are typically mounted on slider (not shown) that flies in proximity to a surface of a magnetic recording media (not shown) in a hard disk drive. The magnetic recording media is, for example, a metal, ceramic or plastic disk coated with a magnetic thin film. Read/write head 100 comprises a magnetic field sensor 101 to read data and a magnetic field generator to write data on the disk. The magnetic field generator typically includes two poles 103 and 104 that are separated by a "write gap" 102. A magnetic field is generated when poles 103 and 104 are excited by a current flowing in coil 105. When write gap 102 is in proximity to the magnetic media, a magnetic field generated by poles 103 and 104 creates selected magnetic orientations in selected locations on the magnetic media.

Magnetic field sensor 101 may comprise a MR element or GMR element positioned between two shield elements 103 and 106. Shield element 103 serves as both a shield for magnetic field sensor 101 and a pole for the magnetic field generator and is commonly referred to herein as a shared shield/pole element 103. While the present invention has particular utility in GMR read/write heads, it is also useful for conventional MR based designs. For ease of description the present invention is described herein in terms of a GMR read/write head, however, it should be understood that MR read/write heads are an equivalent substitute for purposes of a present invention.

Figure 8:
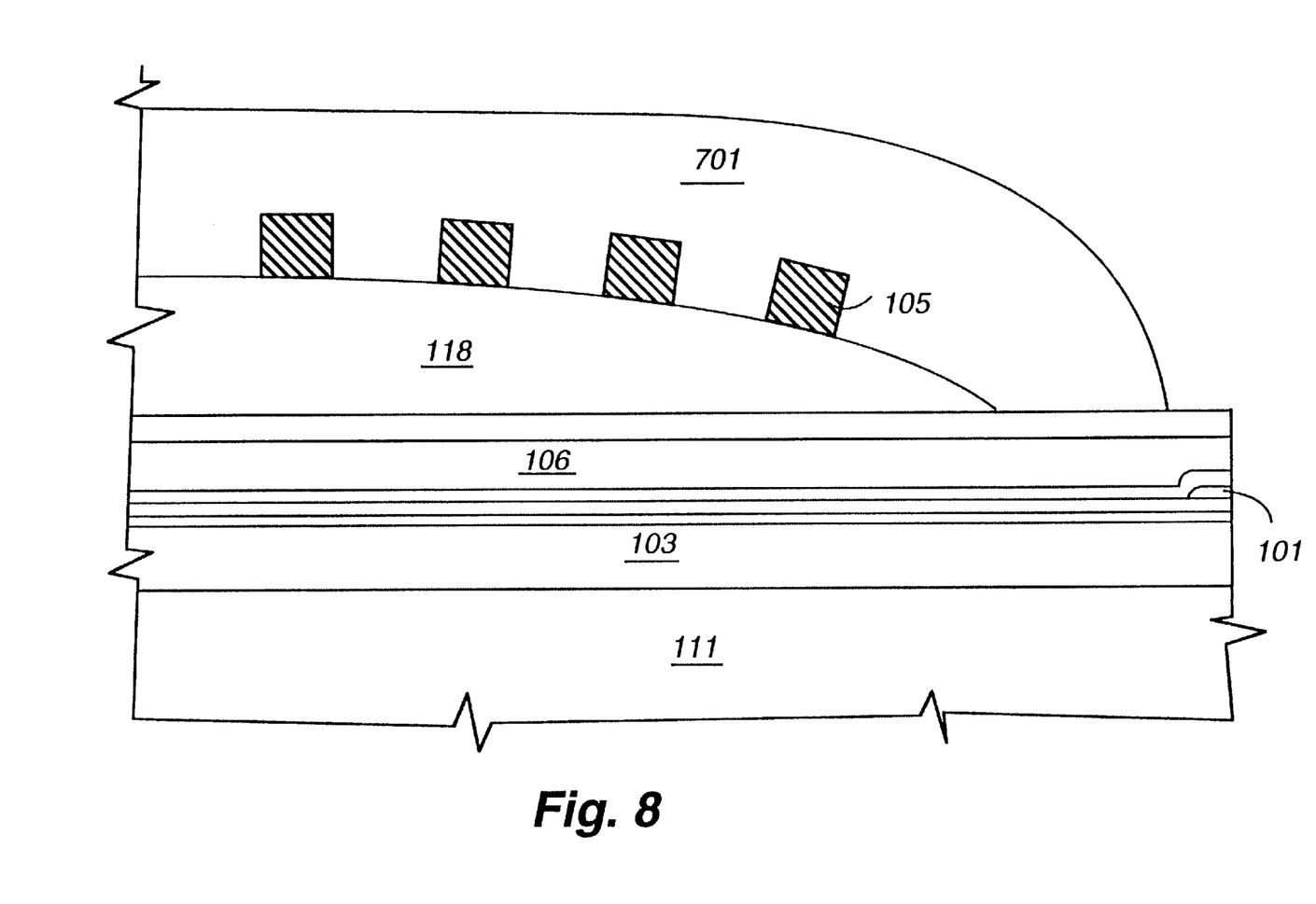
FIG. 8 illustrates the structure shown in FIG. 7 with further processing.
Figure 9:
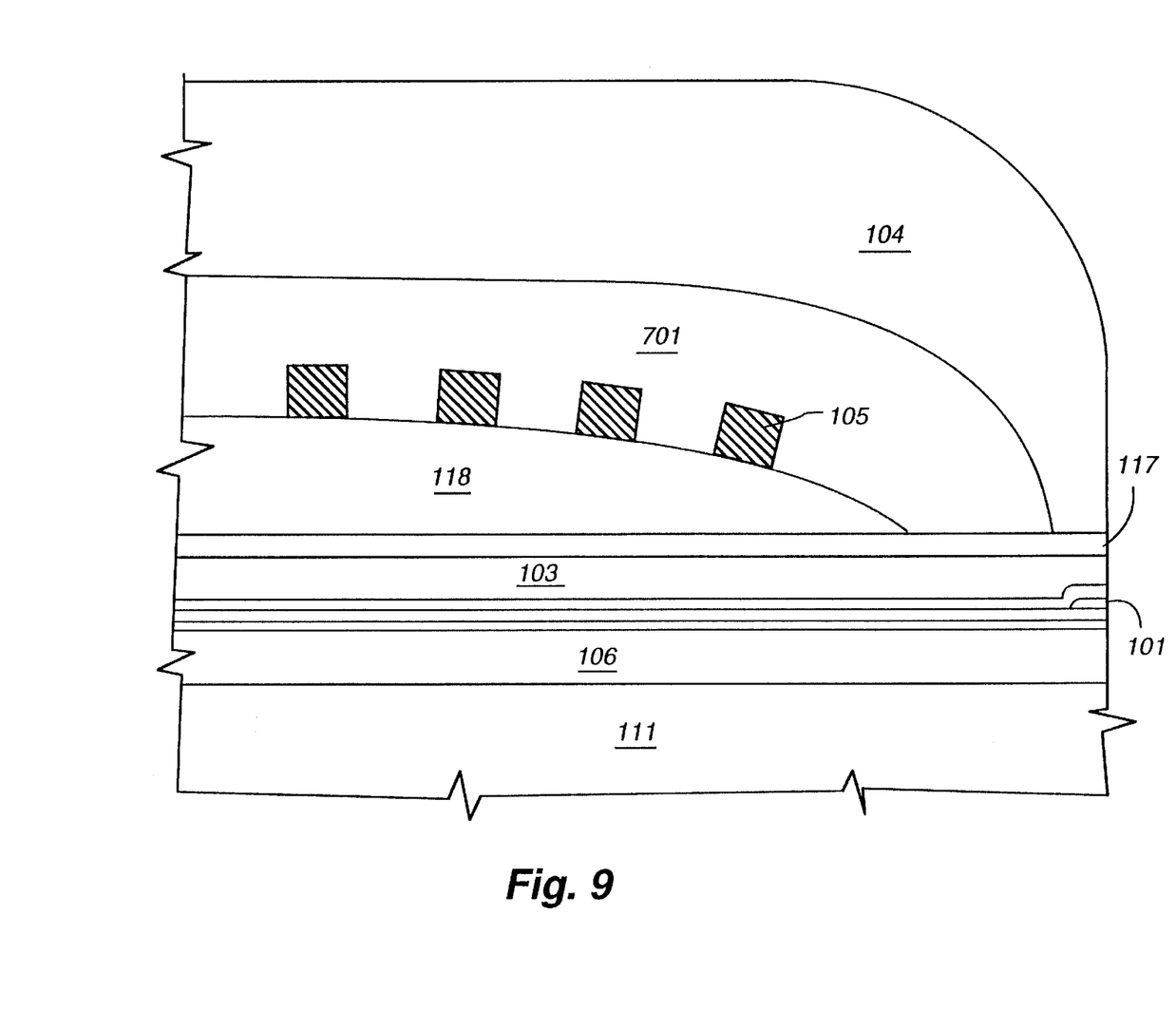
FIG. 9 illustrates the read/write head in accordance with the present invention at a near final stage of processing.
Figure 10:
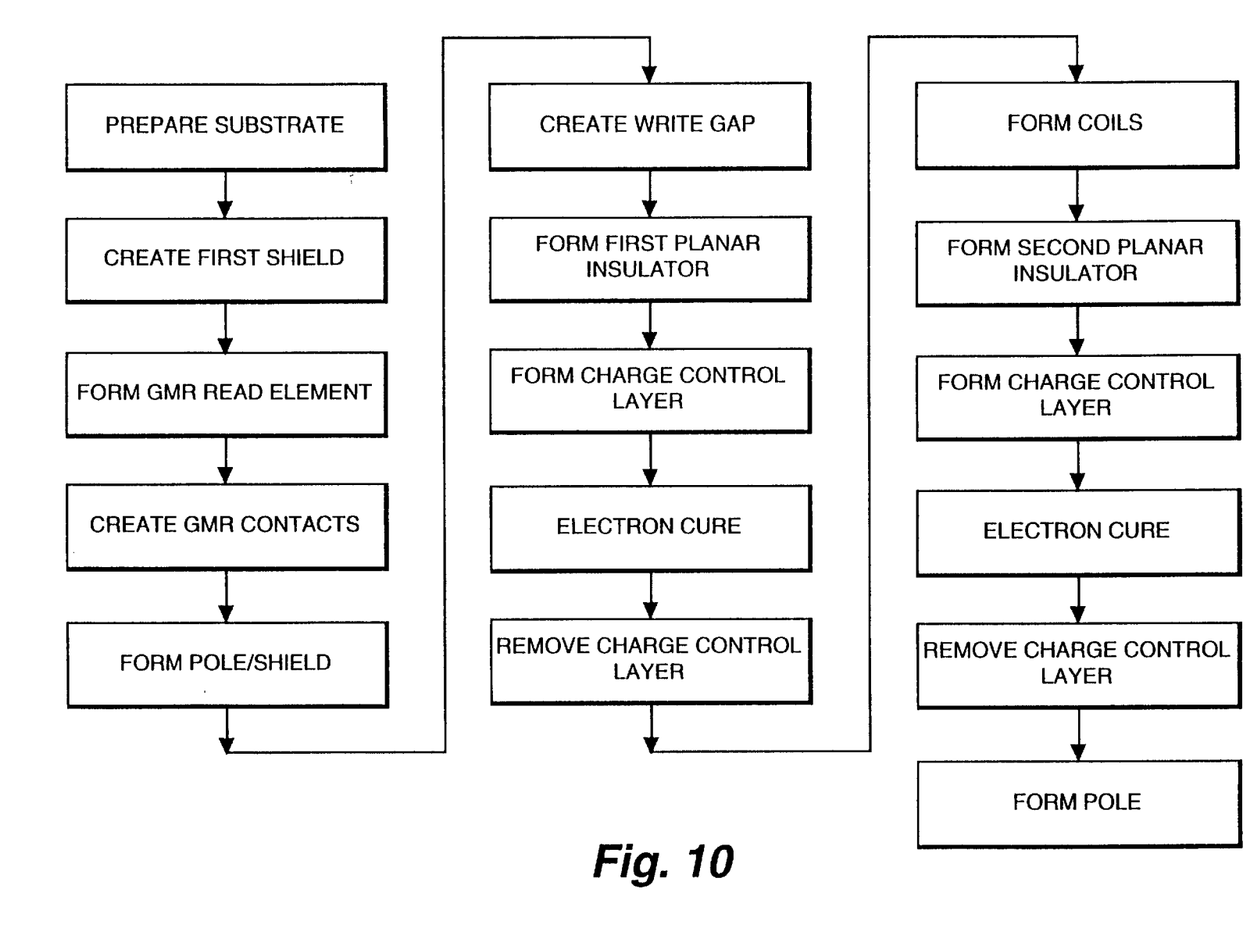
FIG. 10 illustrates a flow diagram of significant process steps of a method in accordance with the present invention.

FIG. 2 through FIG. 9 shows cross section illustrating fabrications steps to form read/write head 100 in accordance with the present invention. FIG. 10 illustrates a flow diagram of significant process steps and should be referenced together with the descriptions of FIG. 2–FIG. 9. To aid understanding the present invention is described in terms of specific materials and specific processes. However, unless expressly stated otherwise, equivalent processes may be substituted for the specific examples disclosed herein. In this manner the present invention may be adapted for use with available processing technology and designs without departing from the scope and spirit of the present invention.

Figure 2:
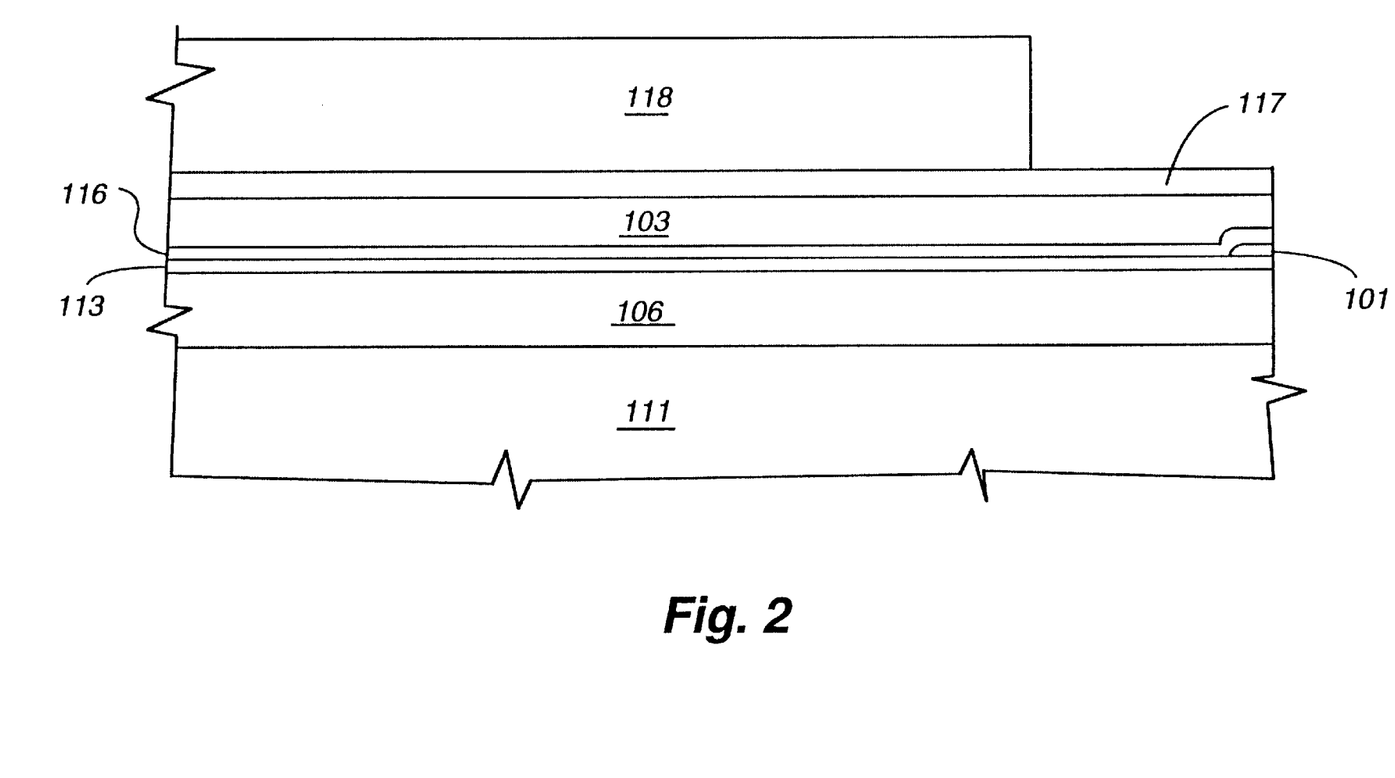
FIG. 2 shows an enlarged view of the read/write head shown in FIG. 1 at an early stage of processing.

As shown in FIG. 2, read/write head 100 is formed on a substrate 111 that comprises, for example a ceramic base having an upper surface comprising approximately fifteen microns of sputter deposited silicon oxide or aluminum oxide ($Al_2O_3$) or alumina. A specific example of suitable ceramic base material is alumina with titanium carbide. Suitable equivalents for substrate 111 include silicon, glass, and the like. The upper surface of substrate 111 is polished using mechanical and/or chemical-mechanical polishing to have sub-micron surface defects.

Shield 106 comprises nickel iron alloy (i.e., permalloy) that is plated to a thickness of two to three microns. The plating can be performed, for example, by electroplating using a conductive seed layer of approximately 1000 angstrom thickness formed by sputtering onto substrate 111. The seed layer comprises nickel iron in the specific example and is patterned by conventional photolithography and etch techniques to define the shape of shield 106. After the electrodeposition of shield 106, the photoresist is stripped using available wet or dry photoresist removal techniques. Equivalently, the photoresist may be removed before plating, or the photolithography and patterning steps performed after electrodeposition depending on the tolerances permitted by a particular design.

GMR element 107 is separated from shield element 106 by a thin separation layer of non-magnetic material 113 such as sputter deposited alumina or aluminum nitride. Layer 113 is sometimes referred to as a "read gap" layer. Read gap layer 113 can be formed by blanket deposition of from twenty to two thousand angstroms of a non-magnetic metal or dielectric material.

Magnetic sensor 101 comprising a MR or GMR magnetic sensing element comprises a magnetoresistive film and biasing layer of appropriate thickness. Suitable MR and GMR element designs are known and are described in U.S. Pat. No. 5,573,809 issued Nov. 12, 1996 and assigned to the assignee of the present application. Magnetic sensor 101 is typically formed by blanket deposition by ion beam deposition, evaporation or sputtering of appropriate thin film layers of material and subsequent photolithography and patterning. Conductive electrodes are provided over magnetic sensor 101 using available conductor deposition and patterning techniques. Magnetic sensor 101 and the exposed portions of read gap layer 113 are covered by a second gap layer 116 comprising materials the same as or similar to those used in read gap layer 113. To complete the read portion of the read/write head in accordance with the present invention, read gap layer 116 is covered by a merged shield-pole 103 comprising two to three microns of electroplated permalloy. Shield-pole 103 is typically deposited and patterned in a manner similar to shield 106 described hereinbefore.

Write gap 117 is formed by sputter deposition of approximately one to one to four thousand angstroms of non-magnetic material such as alumina. A blanket of photoresist is applied to form first insulator 118 upon which coils 105 (shown in FIG. 1) will be formed. As applied, first insulator 118 is from 0.5 to 10 microns thick and comprises a suitable crosslinkable polymer, an crosslinking agent (e.g., photoinitiator and/or other energy activated compound that acts as a catalyst for crosslinking), and a solvent. In a specific example, three to four microns of AZ4000 positive photoresist (available from Hoechst Celanese, Inc.) is used to form first insulator 118, Other crosslinkable polymer materials, including negative photoresist materials, may be used. First insulator 118 is patterned by irradiation by optical energy to which the photoinitiator is sensitive (i.e., actinic radiation) through a shadow mask and subsequent pattern development.

Figure 3:
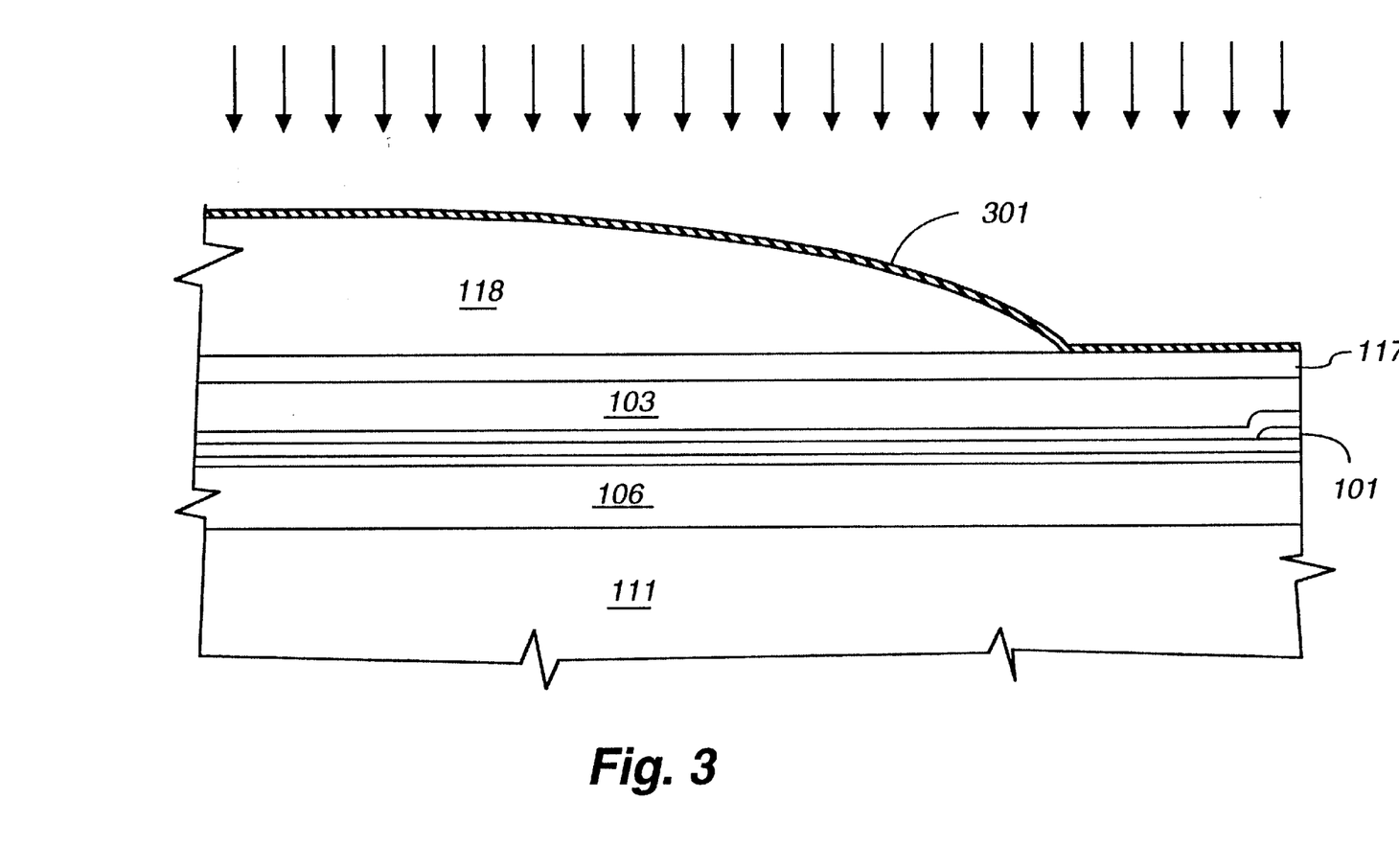
FIG. 3 shows the read/write head illustrated in FIG. 2 at a later stage in processing.

In accordance with the present invention, first insulator 118 is cured or hard baked after patterning using electron beam irradiation as shown in FIG. 3. The cure process should substantially completely crosslink the crosslinkable polymer content of first insulator 118. Also, the cure process desirably drives out substantially all of the solvents in first insulator 118. Although photoresist materials are available that are expressly designed for electron beam cure, it has been found that photoresist materials designed for thermal curing can be suitably cured using electron beam irradiation in accordance with the present invention.

First insulating layer 118 experiences some flow after curing resulting in rounded or sloping edges shown in FIG. 3. It is desirable to minimize the amount of flow during the cure process to simplify later processing and to increase the apex angle (i.e., the angle at which pole 102 approaches pole/shield 103 over the write gap shown in FIG. 1). The amount of flow occurring in prior thermal cure processes results in a non-optimally low apex angle that results in lower write head efficiency. The electron beam cure in accordance with the present invention results in significantly reduced flow due to rapid crosslinking that hardens the insulating layer and prevents flow at temperatures up to 280 C. Significantly, the electron beam cure process in accordance with the present invention enables greater control over the flow, allowing some flow to occur using heat generated in the electron cure process alone or in combination with a low temperature (i.e., 100–160 C. for approximately one hour) bake before the electron cure process.

In accordance with the present invention, electron beam curing can be accomplished by flood exposure of first insulator structures 118 at an electron beam voltage of from 1 to 30,000 volts or higher depending on the thickness chosen for first insulator structure 118. Electron beam current density is preferably in a range from 0.1 to 15 milliamp (mA) per $cm^2$.

A limiting factor with respect to beam current density is heating of read/write head structure 100 caused by the electron beam. In accordance with the present invention, beam current density is selected to maintain read/write head 100 generally, and magnetic field sensor 101 specifically, at a temperature below 170 C. and preferably below 150 C. during the cure process. As set forth below in reference to FIG. 11, modifications to the electron beam cure apparatus in accordance with the present invention are made to reduce temperature of substrate 111 by active cooling during the electron beam cure process that allow higher beam current density, hence, reduced cure times.

Using a beam dose of 11,000 $\mu C/cm^2$ first insulator 118 has been suitably cured in two to twenty minutes. As compared to conventional thermal cure processes, the electron cure process in accordance with the present invention not only reduces absolute temperature from more than 200 C. to less than 170 C., but also reduces time at temperature from several hours to a few minutes. These factors work cooperatively to reduce the thermal budget (i.e., time at temperature) impact on the entire processing of read/write head 100. GMR materials have a small thermal budget because high temperatures promote severe interdiffusion between ultrathin layers in GMR materials. Hence, when magnetic field sensor 101 comprises GMR material, the present invention is particularly advantageous. However, the reduced cycle time for the cure process offers significant advantages regardless of the device thermal budget.

Optionally, the present invention includes deposition of a charge control layer 301 before performing the electron cure process. In FIG. 3 the relative thickness of charge control layer 301 is exaggerated to ease illustration. In practice, charge control layer 301 comprises a thin (i.e., 100 angstroms or less) conductive layer comprising a refractory metal or noble metal. Suitable refractory metals include chromium, tungsten, titanium, tantalum and the like. Suitable noble metals include gold, silver, copper and the like. The choice of material for charge control layer 301 is based upon available materials that can be removed or patterned following the electron cure process.

Another feature in accordance with the present invention that is believed to reduce charge accumulation is using a positively ionized gas ambient during the electron cure process. The ionized gas provides positive ions that can reach the surface of read/write head 100 during the electron cure process and neutralize some charge accumulation. A suitable ambient preferably comprises a neutral species such as nitrogen at a pressure selected to give a mean free path sufficient to allow a suitable number of positive ions to reach the surface of read/write head 100.

Charge control layer 301 serves to prevent charge accumulation on buried conductors within read/write head 100. Several read/write head designs include buried conductors that serve, for example, to make electrical contact to magnetic field sensor 101. These buried conductors do not have a conductive surface exposed to the plasma in the electron beam apparatus (shown in FIG. 11) and so can accumulate significant charge during the electron beam cure process in accordance with the present invention. The charge accumulation can result in electrostatic discharge between conductive components that may damage device structures such as magnetic field sensor 101. Inclusion of charge control layer 301 will minimize the risk of such charge build up.

Figure 4:
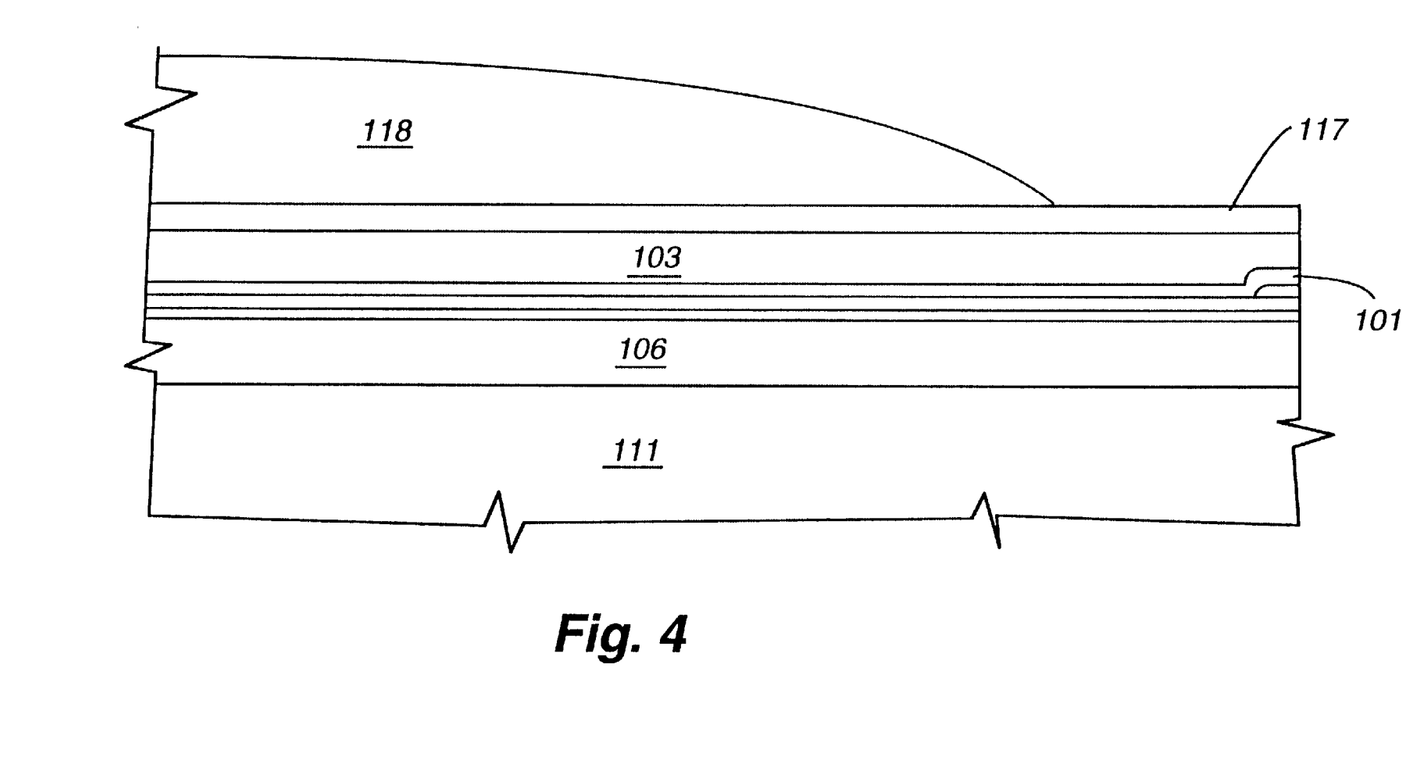
FIG. 4 shown the read/write head illustrated in FIG. 3 at a later stage in processing.

Charge control layer 301 is optional and may be eliminated in designs where charge build up is proven to be insignificant, or in designs that leave conductors exposed to the plasma during the electron beam cure process. Charge control layer 301 is removed by appropriate etch/strip technology after the electron beam cure procedure as shown in FIG. 4. Alternatively, charge control layer 301 can be converted to a non-conductive form by, for example, oxidation or nitridation subsequent to the electron beam cure procedure so as to prevent electrical shorting and enhance the isolation qualities of first insulator 118. As another alternative, charge control layer 301 may remain to serve as a part of a seed layer (501 shown in FIG. 5).

Figure 5:
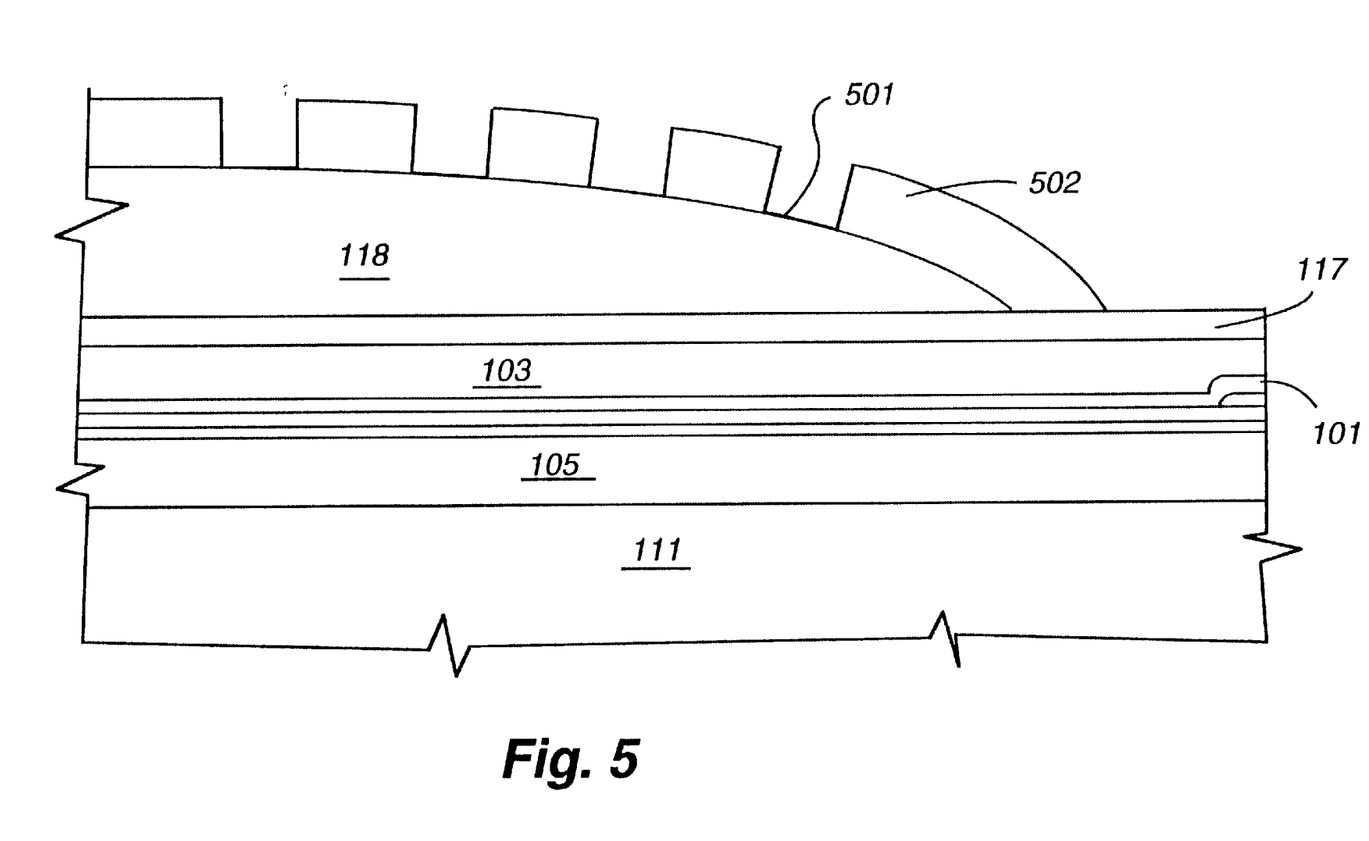
FIG. 5 illustrates the read/write head shown in FIG. 4 at a later stage in processing.
Figure 6:
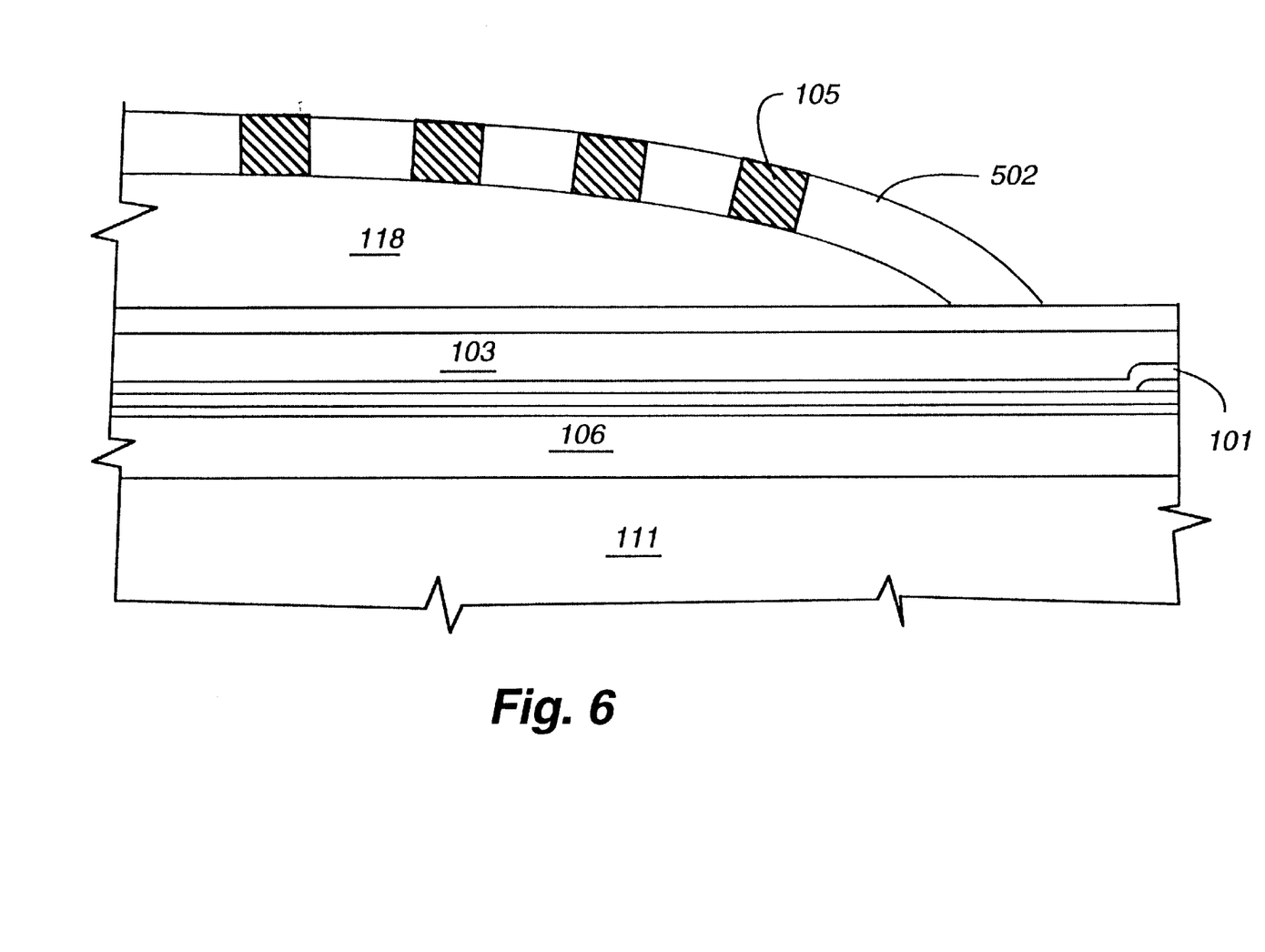
FIG. 6 shows the read/write head illustrated in FIG. 5 at a still later stage in processing.

FIG. 5 and FIG. 6 illustrate the formation of coil 105 shown in FIG. 1). Coil 105 comprises a conductive material such as copper or gold. In a specific example, coil 105 is formed by providing seed layer 501 of copper or chromium-copper having a thickness of about 1000 angstroms on top of first insulator 118. Where charge control layer 301 comprises a material compatible with seed layer 501, a portion of seed layer 501 can be provided by charge control layer 301. However, charge control layer 301 is less than 100 angstrom thick, and is not suitable to serve as a seed layer without additional deposition to increase thickness.

A photoresist frame 502 is applied and patterned to define the location of coil 105. As shown in FIG. 6, copper, copper alloy, or a suitable equivalent is electroplated to a thickness of about four microns. Frame 502 is removed and excess conductive material is removed by available photolithography and etch techniques to remove any undesired conductive paths between adjacent portions of coil 105.

Figure 7:
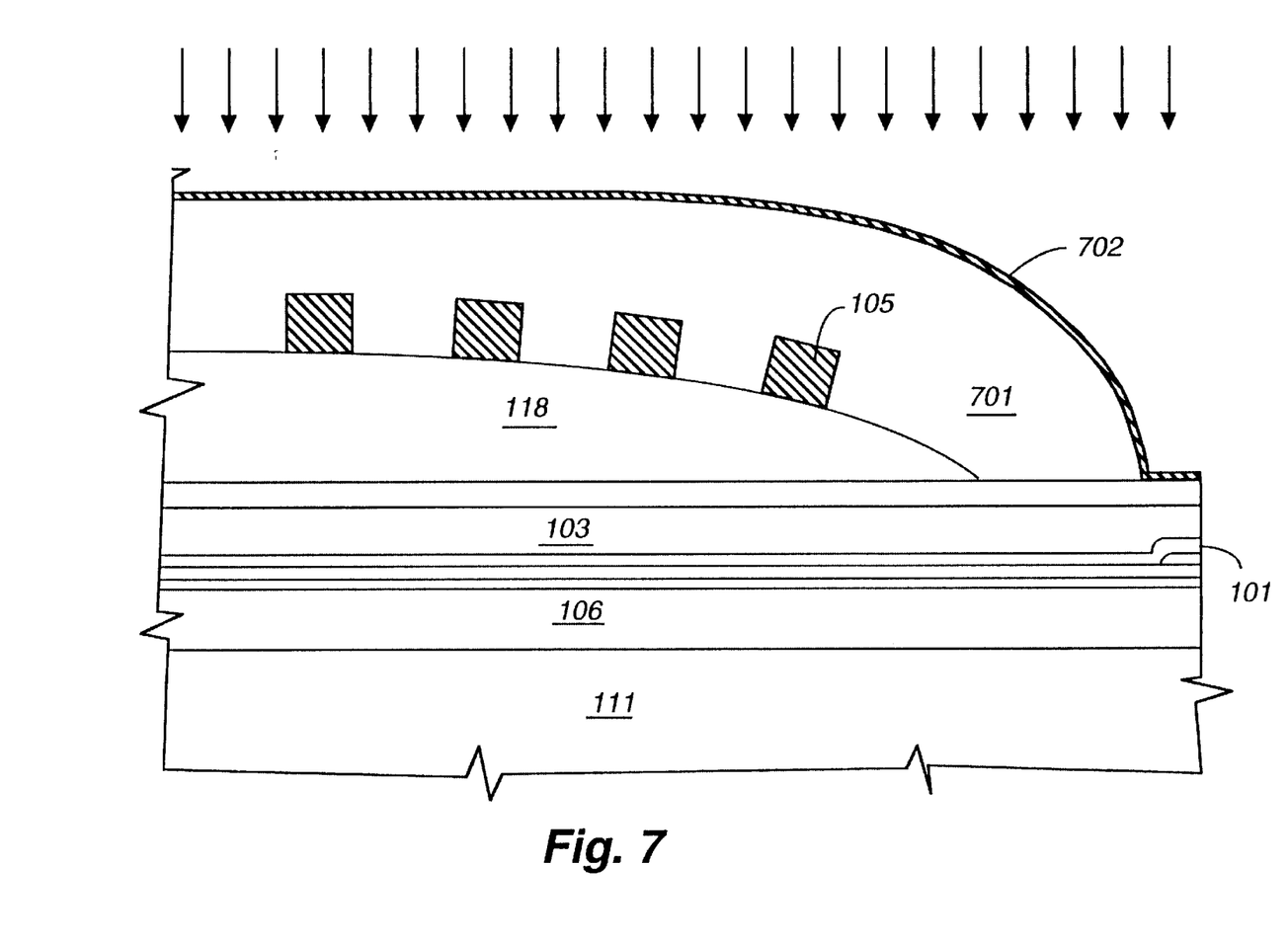
FIG. 7 shows the structure illustrated in FIG. 6 as a late stage in processing.

Coil 105 is covered by a second insulator 701 that is formed in a manner analogous to first insulator 118. A layer of photoresist such as AZ4000 series positive photoresist is applied by spin, spray, or other available resist application techniques to a thickness of about five microns. The thickness chosen to completely fill between adjacent portion of coil 105 and to separate the tops of coil 105 from pole 104 (shown in FIG. 1) by a selected amount. Second insulator 701 is preferably cured using an electron beam irradiation process substantially similar to that used to cure first insulator 118. An optional charge control layer 702 is applied to inhibit charge accumulation on buried conductors. A brief low temperature bake may be used prior to the electron irradiation process to control the slope of second insulator 701 caused by resist flow.

Prior thermal cure processes resulted in significant shrinkage of second insulator 701 during the cure process. This shrinkage is of such a magnitude that often a third insulating layer was required over the second insulating layer to provide adequate thickness and suitable topography for the insulator over coil 105. This third insulating layer increased the number of processing steps, required further cure time, and increased the cycle time and cost to produce an MR read/write head. It has been found that by using electron irradiation in accordance with the present invention, shrinkage is minimized and a single application of photoresist results in suitable coverage and topography for second insulator 701 that additional layers are not required.

As shown in FIG. 8, charge control layer 701 is removed by available etch and strip techniques to form a structure having an insulating upper surface and a portion of write gap layer 117 exposed over magnetic field sensor 101. As shown in FIG. 9, upper pole 104 is formed by deposition of a seed layer and electroplating of a magnetic material such as permalloy to a thickness of three to four microns. As a result of the desirable topography of second insulator 701, the apex angle formed by pole 104 provides an efficient write element.

Figure 11:
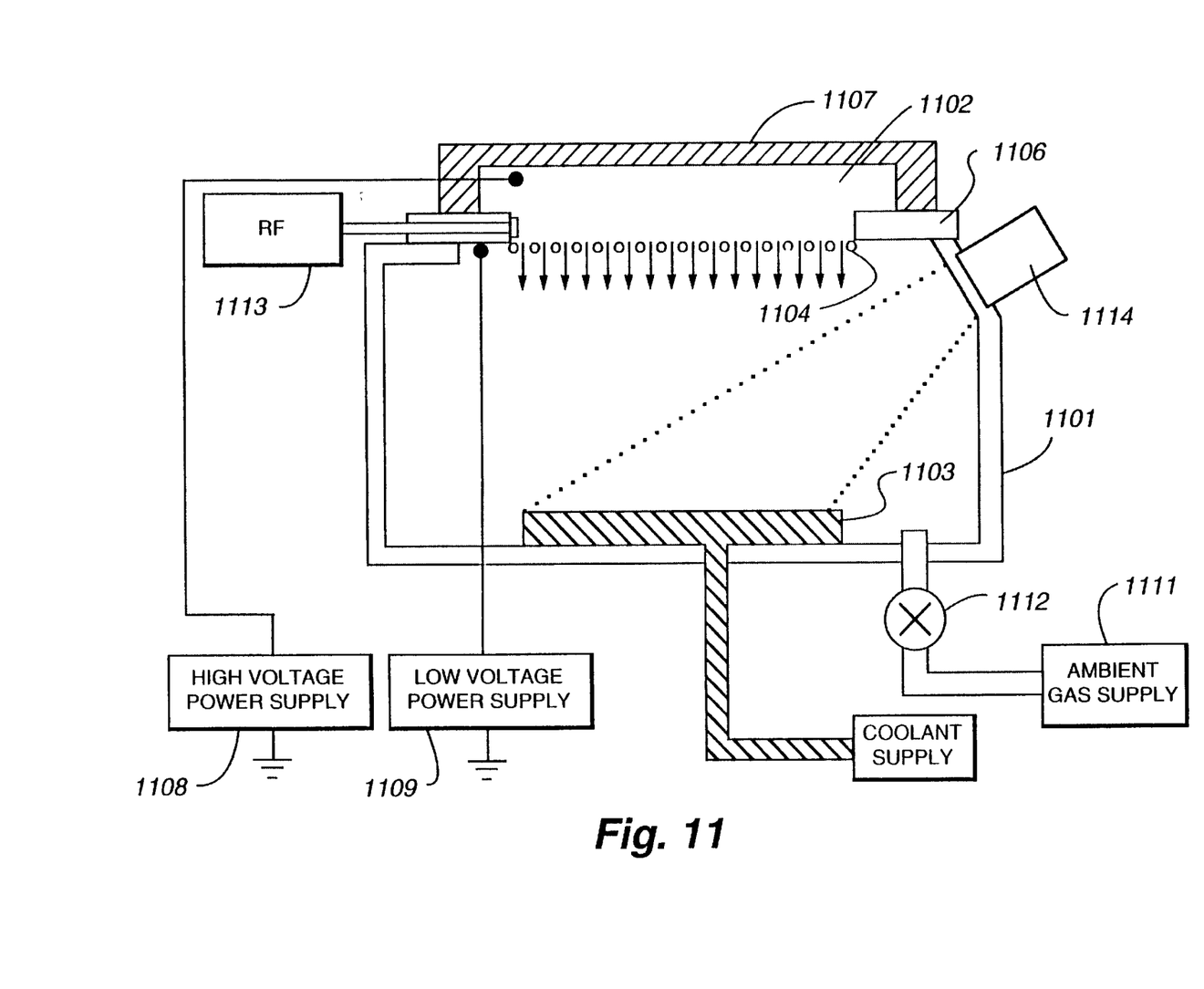
FIG. 11 illustrates an apparatus for electron beam curing in accordance with the present invention.

FIG. 11 illustrates an electron beam apparatus in accordance with another aspect of the present invention that enables formation of first insulator 118 and second insulator 701 described hereinbefore. FIG. 11 shows a cold cathode gas discharge electron source that includes chamber 1101, a large-area cathode 1102, a substrate platform 1103 and a grid anode 1104 placed between substrate support 1103 and cathode 1102. Basic operation of an electron beam apparatus similar to that shown in FIG. 11 is described in U.S. Pat. No. 5,003,178 issued on Mar. 26, 1991. Grid 1104 is electrically isolated from cathode 1102 by insulator 1106.

Variable high voltage supply 1108 supplies a voltage of from 500 to 30,000 volts or higher to cathode 1102. A variable low voltage power supply 1109 is coupled to anode grid 1104. Ambient gas supply 1111 supplies an ionizable ambient, non reactive gas such as nitrogen at a preselected pressure controlled by valve 1112.

In operation, a high negative voltage is applied to cathode 1102 and the ambient gas within chamber 1101 is ionized by, for example, a spark gap, naturally occuring gamma rays, introduction of RF or microwave energy by generator 1113, or introduction of optical energy by optical energy source 1114. Once ionization occurs, positive ions are attracted to grid anode 1104 by a negative voltage supplied by low voltage power supply 1109. The positively charged ions are accelerated as they pass through grid anode 1104 towards cathode 1102. Secondary electrons are produced when the positive ions strike cathode 1102. The secondary electrons are accelerated and collimated as they travel towards and through grid anode 1104. As the secondary electrons travel through chamber 1101, the ambient gas is further ionized to sustain the process.

In accordance with the present invention, the electron beam apparatus includes a coolant supply such as chilled fluid coupled to cool substrate support 1103 during the electron cure process. Equivalently, other cooling techniques such as heat pumps or Peltier coolers are known and could be used to chill substrate support 1103.

Another feature in accordance with the present invention is the optional addition of secondary energy sources such as generator 1113 and/or optical energy generator 1114 that can be used to supply additional energy within chamber 1101 during electron irradiation that will enhance crosslinking of a polymer without substantially increasing temperature of the workpiece. The use of secondary energy sources is optional, and suitable electron beam curing has been experimentally demonstrated without the necessity of secondary energy sources.

Although the invention has been described and illustrated with a certain degree of particularity, it is understood that the present disclosure has been made only by way of example. For example, the present invention is described in terms of a merged read/write head for a magnetic disk drive, however, the teachings of the present invention can be applied to a magnetic tape drive or other magnetic recording media with minor modification. Also, the present invention can be applied to form an insulator at low temperature in any structure. Numerous changes in the combination and arrangement of parts can be resorted to by those skilled in the art without departing from the spirit and scope of the invention, as hereinafter claimed.

We claim:

1. A head structure for writing data on a magnetic media comprising:

a first pole having an upper surface;

a first electron cured insulator layer covering a portion of the upper surface;

a plurality of conductive coils formed on the first electron cured insulator layer;

a second electron cured insulator layer filling between and covering the plurality of coils; and a second pole covering the second electron cured insulator layer so as to define a write gap between the first pole and the second pole.

2. The head structure of claim 1 further comprising a giant magnetoresistive read head having a structure and stoichiometry consistent with processing below 150 C.

3. The head structure of claim 1 wherein the first and second electron cured insulators comprise photoresist.

4. A head structure for writing data on a magnetic media comprising:

a first pole having an upper surface;

a first insulator layer comprising an electron curable polymer covering a portion of the upper surface;

a plurality of conductive coils formed on the first electron cured insulator layer;

a second insulator layer comprising the electron curable polymer filling between and covering the plurality of coils; and a second pole covering the second insulator layer so as to define a write gap between the first pole and the second pole.

5. The head structure of claim 4 further comprising a giant magnetoresistive read had having a structure and stoichiometry consistent with processing below 150 C.

6. A head structure for accessing data on a magnetic media comprising:

a plurality of conductive coils;

an insulator layer comprising electron-cured photoresist surrounding the conductive coils.

7. The head structure of claim 6 further comprising a giant magnetoresistive read had formed integrally with the insulator layer having a structure and stoichiometry consistent with processing below 150 C.

* * * * *